(12) United States Patent
Hsu et al.

(10) Patent No.: US 10,892,341 B2
(45) Date of Patent: Jan. 12, 2021

(54) FLASH MEMORY WITH ASSISTANT GATE AND METHOD OF FABRICATING THE SAME

(71) Applicant: Powerchip Semiconductor Manufacturing Corporation, Hsinchu (TW)

(72) Inventors: Hann-Jye Hsu, Hsinchu (TW); Cheng-Yuan Hsu, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 16/520,305

(22) Filed: Jul. 23, 2019

(65) Prior Publication Data

US 2020/0365700 A1    Nov. 19, 2020

(30) Foreign Application Priority Data

May 15, 2019    (TW) .............................. 108116696 A (51) Int. Cl.
*H01L 29/423*    (2006.01)
*G11C 16/26*    (2006.01)
(Continued)

(52) U.S. Cl.
CPC .... *H01L 29/42328* (2013.01); *G11C 16/0408* (2013.01); *G11C 16/10* (2013.01); *G11C 16/14* (2013.01); *G11C 16/26* (2013.01); *H01L 21/0217* (2013.01); *H01L 21/0223* (2013.01); *H01L 21/26513* (2013.01); *H01L 21/31111* (2013.01); *H01L 21/32133* (2013.01); *H01L 23/528* (2013.01); *H01L 27/11524* (2013.01); *H01L 29/0847* (2013.01); *H01L 29/40114* (2019.08); *H01L 29/4916* (2013.01); *H01L 29/66825* (2013.01); *H01L 29/7883* (2013.01); *H01L 21/02255* (2013.01)

(58) Field of Classification Search
CPC ..... G11C 16/0408; G11C 16/10; G11C 16/14; G11C 16/26; H01L 29/42328; H01L 29/40114; H01L 29/0847; H01L 29/4916; H01L 29/66825; H01L 29/7883
USPC ..................................... 365/185.29
See application file for complete search history.

(56) References Cited

U.S. PATENT DOCUMENTS 5,801,414 A * 9/1998 Shinmori ............... H01L 27/115
257/315
6,486,509 B1 * 11/2002 Van Houdt ........ G11C 16/0425
257/319

(Continued)

FOREIGN PATENT DOCUMENTS

TW    200727410    7/2007
TW    201013903 A1    4/2010
(Continued)

*Primary Examiner* — Sung Il Cho
(74) *Attorney, Agent, or Firm* — Winston Hsu (57) ABSTRACT

A flash memory with assistant gates, including two floating gates disposed on a substrate, an insulating layer formed on the two floating gates and the substrate, an assistant gate disposed between the two floating gates, wherein a portion of the assistant gate wraps around the two floating gates, and two select gates disposed respectively outside the two floating gates and partially overlap the two floating gates.

4 Claims, 9 Drawing Sheets

(51) Int. Cl.
*H01L 29/08* (2006.01)
*H01L 23/528* (2006.01)
*G11C 16/14* (2006.01)
*H01L 29/788* (2006.01)
*H01L 29/49* (2006.01)
*H01L 29/66* (2006.01)
*H01L 21/28* (2006.01)
*H01L 21/3213* (2006.01)
*H01L 21/311* (2006.01)
*H01L 21/02* (2006.01)
*H01L 21/265* (2006.01)
*G11C 16/04* (2006.01)
*G11C 16/10* (2006.01)
*H01L 27/11524* (2017.01)

(56) References Cited

U.S. PATENT DOCUMENTS

| | | | | |
|---|---|---|---|---|
| 2003/0227047 | A1* | 12/2003 | Hsu | H01L 27/115 257/314 |
| 2004/0185615 | A1* | 9/2004 | Ding | H01L 29/42328 438/257 |
| 2007/0171720 | A1* | 7/2007 | Noguchi | H01L 27/115 365/185.17 |
| 2008/0049517 | A1* | 2/2008 | Hung | G11C 16/0433 365/185.28 |
| 2012/0261736 | A1* | 10/2012 | Hsu | H01L 29/66825 257/315 |
| 2014/0015029 | A1* | 1/2014 | Hsu | H01L 27/11521 257/316 |
| 2015/0263123 | A1* | 9/2015 | Cheng | H01L 27/11521 257/319 |
| 2015/0348789 | A1* | 12/2015 | Liao | H01L 27/11521 438/593 |
| 2017/0194056 | A1* | 7/2017 | Heinrich-Barna | G11C 16/10 |
| 2018/0366478 | A1* | 12/2018 | Yi | H01L 29/66825 |
| 2019/0074837 | A1 | 3/2019 | Aurola | |
| 2020/0075614 | A1* | 3/2020 | Huang | G11C 16/0416 |

FOREIGN PATENT DOCUMENTS

| | | |
|---|---|---|
| TW | 201344911 A | 11/2013 |
| TW | I521710 B | 2/2016 |
| TW | I555131 B | 10/2016 |
| TW | 201644037 A | 12/2016 |

* cited by examiner

FLASH MEMORY WITH ASSISTANT GATE AND METHOD OF FABRICATING THE SAME

BACKGROUND OF THE INVENTION

1. Field of the Invention

The present invention relates generally to a flash memory, and more specifically, to a flash memory structure with an assistant gate to lower required operating voltage of the flash memory.

2. Description of the Prior Art

Flash memory has been launched for over thirty years. Unlike dynamic random access memory (DRAM) or static random access memory (SRAM), flash memory is a non-volatile memory with widespread application, especially in the aspect of consumer electronics, including personal computers, mobile communication products, digital camera, etc. All of these devices need memory with compact size, large capacity, low power consumption and high modifiability. Flash memory undoubtedly meets all aforementioned requirements.

Generally, the principle of programming in flash memory is to write electrons into the floating gate of memory cell by utilizing method of hot electron injection and source side injection. The floating gate functions like a potential well to store the electrons inside, while data erasing is generally achieved by utilizing reverse Fowler-Nordheim tunneling. The aforementioned program state or erase state would determine the number of electrons in the floating gate, thereby affecting the channel electric field under the floating gate. Thus, the data state of the memory cell can be judged by read/measured current value.

In the operation of flash memory, the coupling ratio of floating gate decides the reading/programming speed of the flash memory. The coupling ratio of floating gate is related to the overlapping area between floating gate and source. The larger the overlapping area, the better the coupling ratio, and required operating voltage may be thereby reduced. However, with the progress of process technology, the dimension of nowadays floating gate keeps scaling down to the level of nanoscale. Although the dimension of floating gate keeps scaling, the required voltages for programming and erasing are not scaled down in proportion. This burden becomes more and more in the process technology of advanced generation, especially for the application of embedded non-volatile memory. The fabrication of high-voltage transistor relating to peripheral circuit becomes more and more difficult and costly. Even improving the coupling ratio by adopting the approach of increasing the dimension of floating gate, the dimension of entire memory cell would be undoubtedly increased, which violates the development premise of device miniaturization.

SUMMARY OF THE INVENTION

In the light of flash memory in prior art requiring high operating voltage and hard to scale down, the present invention hereby provides a novel flash memory structure with an additional assistant gate to share required operating voltage, thereby enabling further scaling down of memory cell.

One aspect of the present invention is a flash memory with an assistant gate, including a substrate, two floating gates disposed on the substrate, an insulating layer conformally formed on the two floating gates and the substrate, an assistant gate disposed on the insulating layer between the two floating gates, wherein a portion of the assistant wraps around the two floating gates, and two select gates disposed respectively on the insulating layer at outsides of the two floating gates, wherein the select gate partly overlaps the floating gate.

Another aspect of the present invention is a method of fabricating a flash memory with an assistant gate, including steps of providing a substrate, wherein the substrate is provided sequentially with a tunnel oxide layer and a first polysilicon layer thereon, performing a first etch process to etch the polysilicon layer and the tunnel oxide layer to form two floating gates, forming a conformal insulating layer on the two floating gates and the substrate, forming a second polysilicon layer on the insulating layer, and performing a second etch process to etch the second polysilicon layer to form an assistant gate and two select gates, wherein the assistant gate is formed on the insulating layer between the two floating gates, and a portion of the assistant gate wraps around the two floating gates, and the two select gates are formed respectively on the insulating layer at outsides of the two floating gates, and the select gate partly overlaps the floating gate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In addition, the following method description focuses on the formation of a single memory cell and a single MOS transistor, when in fact an array of such memory cells is simultaneously formed in a memory cell area 32 of the substrate 30, and a plurality of such transistors can be simultaneously formed in a peripheral area 34 of the substrate 30. Preferably, such memory cells are formed in columns of active regions that are separated by columns of insulation areas, the formation of which is well known in the art.

[Memory Structure]

Figure 1:
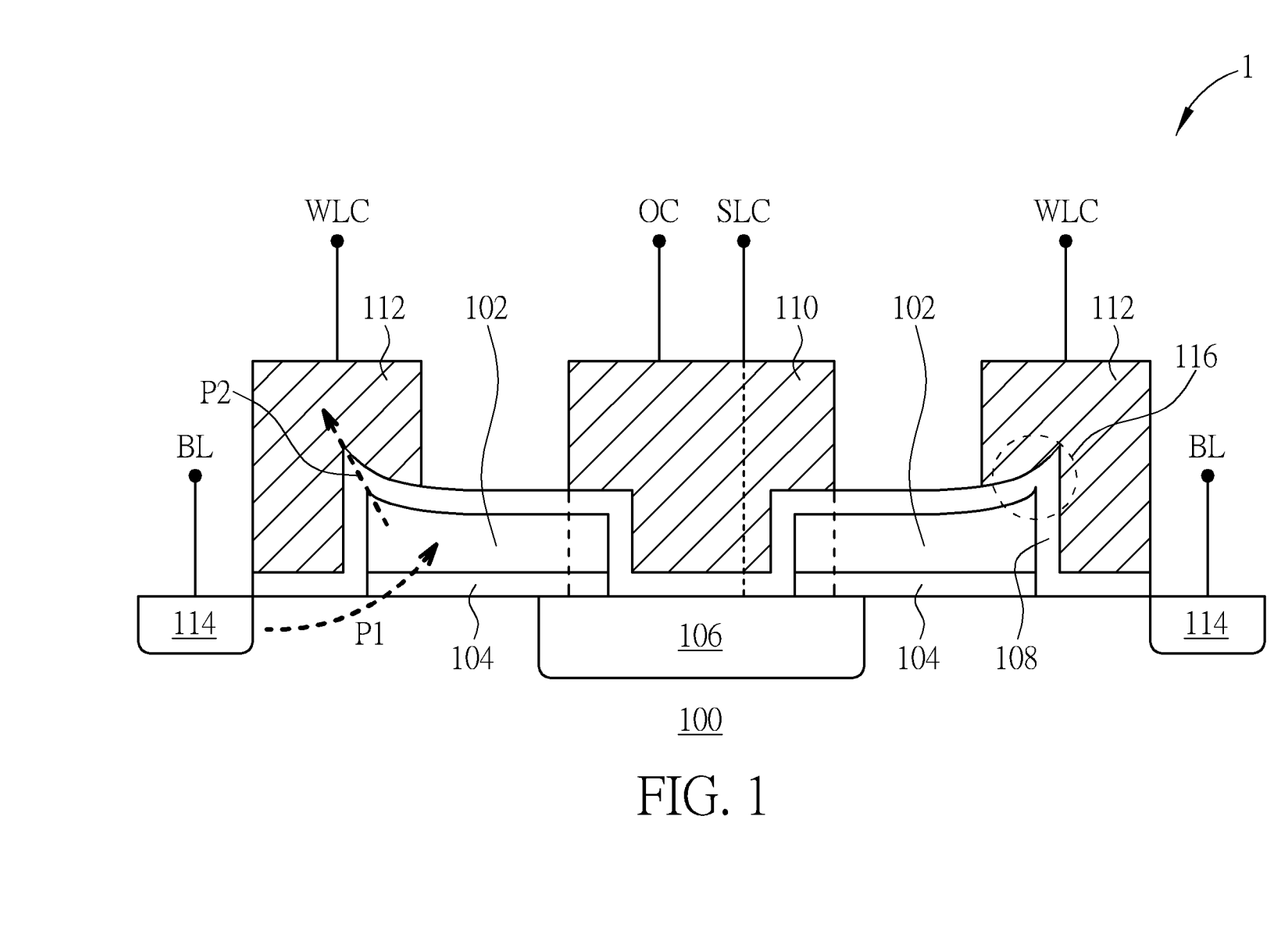
FIG. 1 is a schematic cross-section of an exemplary flash memory in accordance with the preferred embodiment of the present invention.
Figure 2:
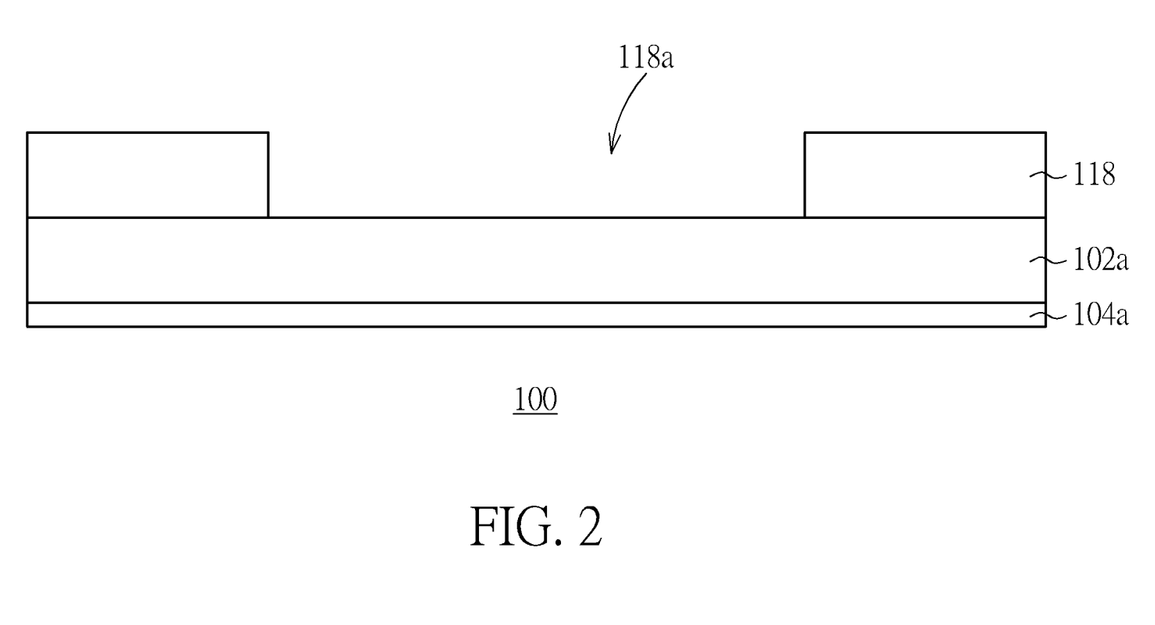
FIGS. 2-9 are schematic cross-sections of process flow of the flash memory shown in FIG. 1 in accordance with the preferred embodiment of the present invention.

Please now refer to FIG. 1, which is a schematic cross-section of an exemplary flash memory in accordance with the preferred embodiment of the present invention. Flash memory 1 may be made on an active area in cell regions of a semiconductor substrate 100. For example, the semiconductor substrate 100 may be a p-type silicon substrate, with multiple active areas defined thereon by shallow trench isolations (STI) or field oxides. Flash memory 1 is formed in theses active areas. However, please note that other semiconductor substrate such as silicon-on-insulator (SOI) or epitaxial substrate may also be applied in the present invention.

Each flash memory 1 includes two floating gates 102 disposed in pair on the substrate 100 and is presented in a form of cell structure with mirror image symmetry. Two floating gates 102 are separated from each other by a distance to provide a space for accommodating assistance gate. A tunnel oxide layer 104 is formed between the floating gate 102 and the substrate 100 to electrically insulate the floating gate 102 and the substrate 100. The floating gate 102 may be made of polysilicon material, and the tunnel oxide layer 104 may be a silicon oxide layer. A source 106 is formed in the substrate 100 between the two floating gates 102, wherein the source 106 partly overlaps the two floating gates 102 to provide the floating gates 102 with better coupling ratio.

An insulating layer 108 is conformally formed on the two floating gates 102 and the substrate 100. An assistant gate 110 is disposed on the insulating layer 108 between the two floating gates 102 and is electrically insulated from the two floating gates 102 by the insulating layer 108. Please note that in the embodiment, a portion of the assistant gate 110 is embedded into the space between the two floating gates 102 and the assistant gate 110 partly overlap the two floating gates 102, so that the assistant gate 110 would wrap around portions of adjacent two floating gates 102. Therefore, the coupling ratio of the floating gate 102 may be further improved through the assistant gate 110.

Two select gates 112 are disposed respectively on the insulating layer 108 at outsides of the two floating gates 102, wherein the select gate 112 would partly overlap the floating gate 102 to provide a path for erasing electrons. Two drains 114 are formed respectively in the substrate 100 at outsides of the two select gates 112. The assistant gate 110 and the select gate 112 may be formed of polysilicon material, and since they are formed in the same process, their top surfaces may be in the same horizontal plane. The insulating layer 108 may be a silicon oxide layer, with tunneling characteristics like tunnel oxide layer 104. Please note that in the embodiment, an upwardly-protruding point portion 116 is formed at outer corner of the floating gate 102 by particular process. The point portion 116 would overlap the select gate 112 to facilitate the erase operation of the flash memory.

The aforementioned embodiment explains the basic structure of flash memory of the present invention, and its various parts would be further electrically connected to other external structures to achieve read/write/erase operations. Refer again to FIG. 1, in the embodiment, the source 106 of flash memory 1 is a source line, which is electrically connected to a source line voltage control circuit SLC to control the source line voltage. The assistant gate 110 of flash memory 1 would be electrically connected to an operating voltage control circuit OC to control the voltage of assistant gate 110. In the embodiment, the select gate 112 of flash memory 1 is a word line. The select gate 112 of memory cells in every row serves as a common word line to be electrically connected to a word line voltage control circuit WLC and to control the voltage of select gate 112. The drain 114 of flash memory 1 is electrically connected to a bit line (BL), which may be disposed above entire flash memory 1, and every bit line BL would be further connected to a bit line voltage control circuit (not shown) to control the bit line BL and the voltage of drain 114 connected therewith.

Operation Mode

In the write (i.e. program) operation of memory, when a selected memory cell is desired to be written or programmed, its drain 114 would be applied with 0V and its select gate 112 would be applied with a positive voltage in the vicinity of the threshold voltage (about 3.3V) of MOS structure defined by the select gate 112. In addition, the source 106 and the assistant gate 110 would be applied with a positive voltage about 6V. Electrons generated from the drain 114 would flow from the drain 114 to the source 106 through a channel under the select gate 112 due to the positive voltage at source 106 and assistant gate 110. When electrons come to the region under the floating gate 102, since floating gate 102 has stronger capacitive coupling with the source 106 and the assistant gate 110 having higher positive voltage, the electrons would be accelerated through the tunnel oxide layer 104 and be injected into the floating gate 102 as indicated by the path P1 shown in FIG. 1, and the electrons are therefore stored in the selected memory cells. This is the principle of source side injection or hot electron injection. In the operation, the source 106 and the assistant gate 110 may share the high positive voltage necessary in the programming of floating gate 102, thus only half of applied positive voltage (about 6V) is required in comparison to the one in prior art. Accordingly, the memory would have lesser demands for peripheral high voltage circuit, and the dimension of memory cell may be further scale down.

In the read operation of memory, the source 106 and the assistant gate 110 would be grounded and the drain 114 would be applied with a read voltage, about 1V, while the select gate 112 would be applied with device's supply voltage ($V_{cc}$). In this circumstance, if the floating gate 102 is positively-charged (i.e. no electron is stored in the floating gate 102), the channel under the floating gate 102 would be opened, and the channel under the select gate 112 would also be opened due to the supply voltage. The electrons would therefore flow from the source 106 to the drain 114, so that the memory would be considered in "1" data state. On the other hand, if the floating gate 102 is negatively-charged, the channel under the floating gate 102 would be closed. No electron would flow from the source 106 to the drain 114, so that the memory would be considered in "0" data state.

Finally, in the erase operation of memory, the source 106 and the drain 114 would be grounded and the select gate 112 would be applied with a positive voltage, about 6V. Particularly, the assistant gate 110 would be applied with a negative voltage, about –5V. The positive voltage at select gate 112 and the negative voltage at assistant gate 110 would make electrons in the floating gate 102 to tunnel through the insulating layer between the floating gate 102 and the select gate 112 due to reverse Fowler-Nordheim tunneling mechanism as indicated by the path P2 shown in FIG. 1. The electrons in the floating gate 102 would therefore be cleared and make the gate positively-charged. The sharp point portion 116 of the floating gate 102 there may enhance the Fowler-Nordheim tunneling mechanism to improve the erasing speed. It should be noted that in the erase operation, the assistant gate 110 may functionally share the voltage like in the read operation. This is quite different from prior art that high positive voltage (about 10-12V) is applied only through select gate or through an additionally disposed erase gate. The assistant gate 110 in the disclosure provides the other half of negative-voltage thrust at the other side to achieve the Fowler-Nordheim tunneling that requires only about half of the positive voltage (i.e. 6V) at the side of select gate 112. Accordingly, the demands for peripheral high voltage circuit may be reduced and the dimension of memory cell may be further scale down.

[Fabricating Method]

Now, please refer sequentially to FIGS. 2-9, which illustrating schematic cross-sections of process flow of the flash memory shown in FIG. 1 in accordance with the preferred embodiment of the present invention. Please refer to FIG. 2 first. Provide a substrate 100, such as a p-type silicon substrate or other semiconductor substrate like silicon-on-insulator substrate or epitaxial substrate, with multiple active areas defined thereon by shallow trench isolations or field oxides. Since the fabrication of aforementioned active areas and isolating structures is not the main point of the present invention, their process flow is hereby omitted. All substrates shown in the figures will be the active area in memory cell region. An oxide layer 104a, such as a silicon oxide layer, is formed on the substrate 100. The oxide layer 104a may be formed on the substrate 100 by conventional skills such as oxidation or deposition (ex. chemical vapor deposition, CVD). A polysilicon layer 102a is formed on the top surface of the oxide layer 104a. The polysilicon layer 102a may be deposited on the oxide layer 104a by conventional skills like low pressure chemical vapor deposition (LPCVD). A silicon nitride layer 118 is formed on the top surface of the polysilicon layer 102a, preferably formed by using CVD method. In the embodiment, the silicon nitride layer 118 is used to define the floating gates, with an opening 118 formed thereon by photolithographic and etch technology to expose underlying polysilicon layer 102a.

Figure 3:
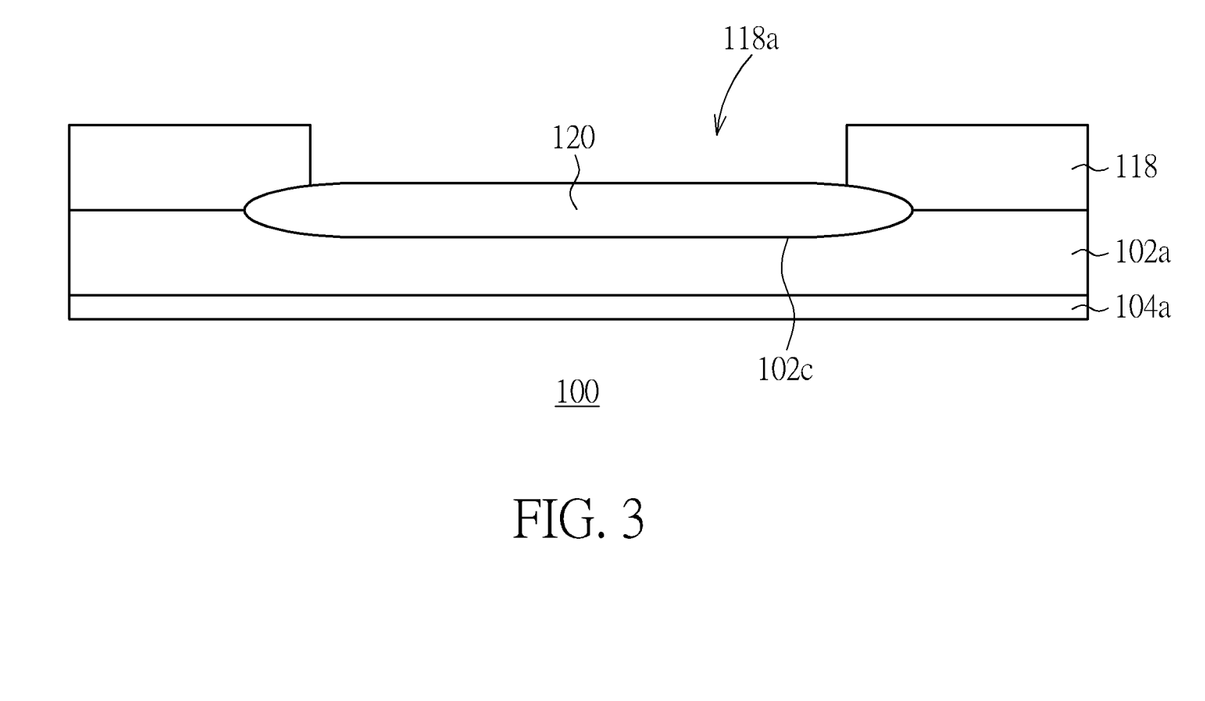

Next, please refer to FIG. 3. Perform a thermal oxidation process to oxidize the polysilicon layer 102a exposed from the opening 118a into a sacrificial oxide layer 120. The sacrificial oxide layer 120 formed by this thermal oxidation step is in a lens shape, with peripheral portion adjacent to the silicon nitride layer 118 tapering and slightly extending under the silicon nitride layer 118. Since the formation of the sacrificial oxide layer 120, remaining polysilicon layer 102a has slightly concave surface 102c.

Figure 4:
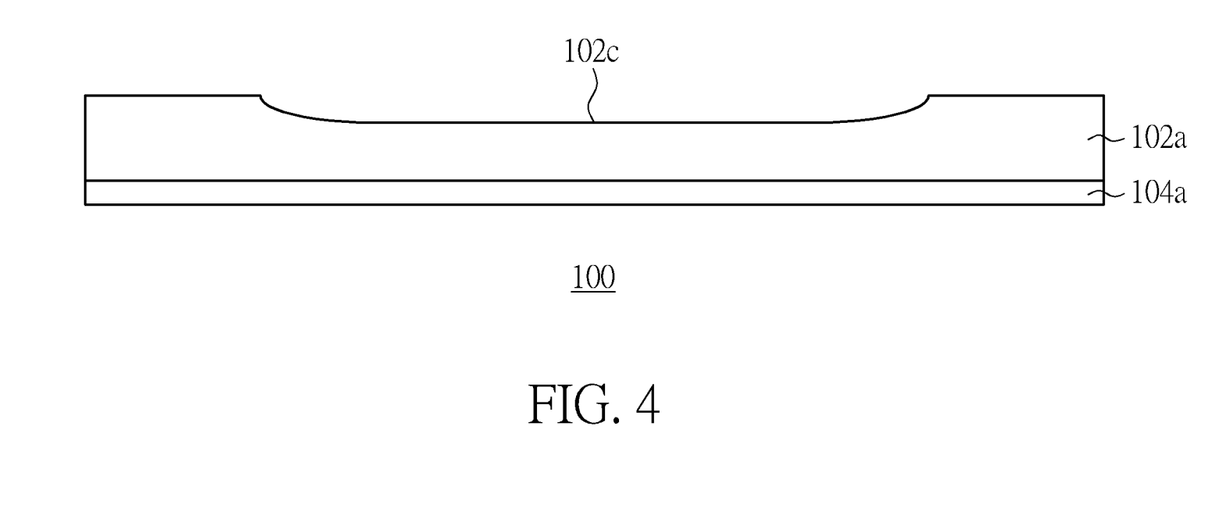

Next, please refer to FIG. 4. Perform a selective etch step to remove the silicon nitride layer 118 and the sacrificial oxide layer 120 formed in previous process to expose underlying polysilicon layer 102a. In this way, the polysilicon layer 102a would have a surface 102c concave from two sides, and the polysilicon layer 102a would be formed with relatively protruding portions.

Figure 5:
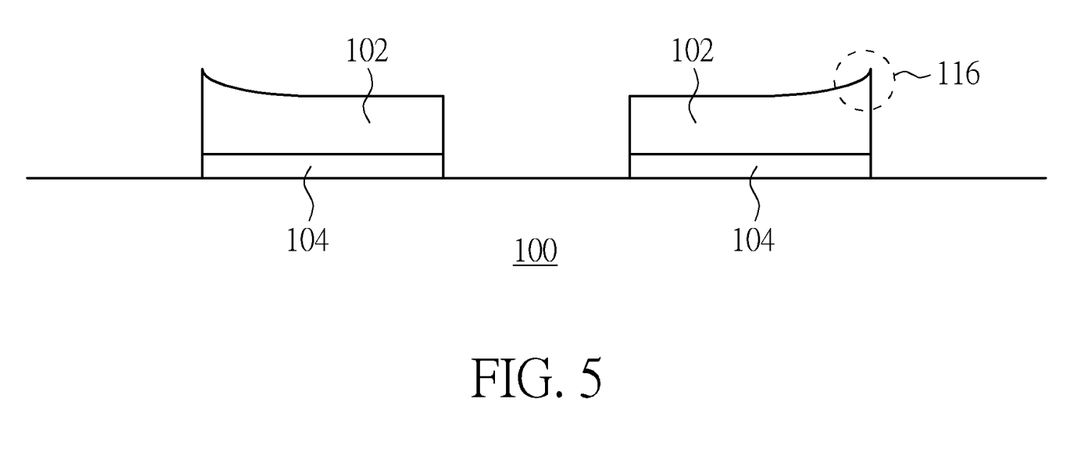

Next, please refer to FIG. 5. Use a photoresist to perform an anisotropic etch process and define the floating gate 102. This anisotropic etch process would remove all polysilicon layer 102a except the portion with concave surface 102c and remove the portion in middle of concave surface 102c, so that the floating gates 102 would be formed with sharp point portion 116 at outer sides in mirror image symmetry as shown in FIG. 5. Please note that this step would also remove a portion of the oxide layer 104a under the polysilicon layer 102a to form a tunnel oxide layer 104 between the floating gate 102 and the substrate 100.

Figure 6:
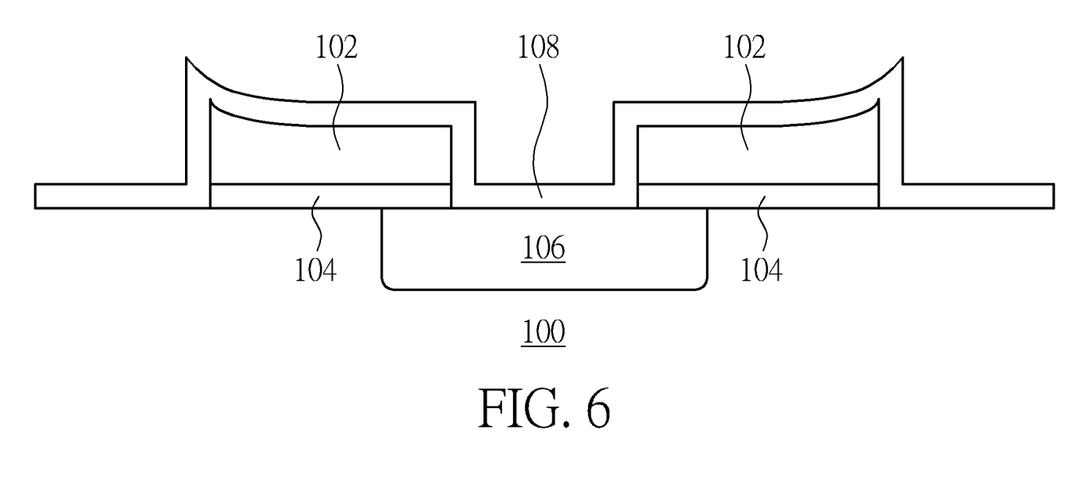

Next, please refer to FIG. 6. Perform an ion implantation process to form source 106 (i.e. source line) in the substrate 100 between the two floating gates 102. A thermal diffusion process may be performed in the duration to cooperatively make the source 106 diffuse and extend toward the floating gates 102, so that the source 106 would partly overlap the two floating gates 102 to achieve capacitive coupling. Thereafter, a conformal insulating layer 108 is formed on the surface of the two floating gates 102 and the substrate 100. The insulating layer 108 may be formed by using thermal oxidation and/or high-temperature oxidation or deposition processes, etc.

Figure 7:
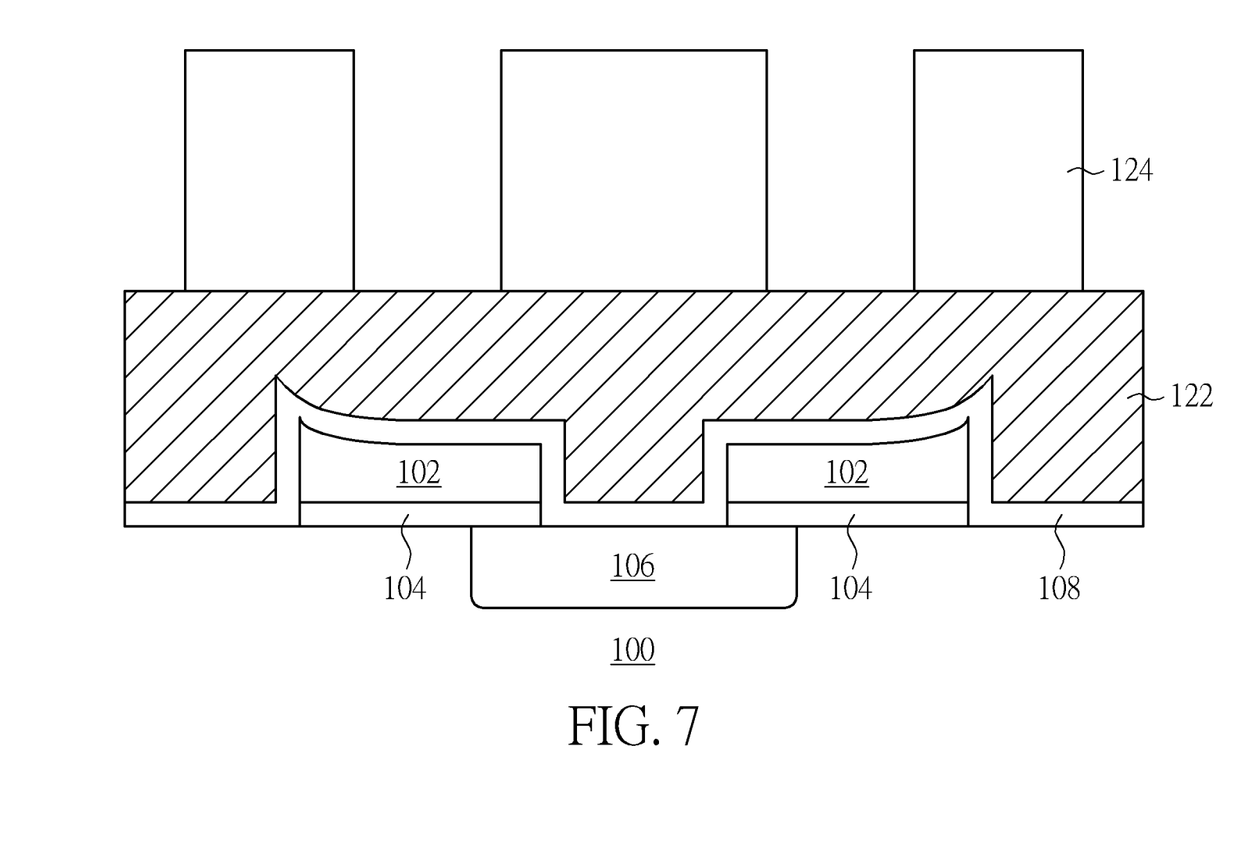

Next, please refer to FIG. 7. Form another thick polysilicon layer 122 on the insulating layer 108, preferably by LPCVD process, and form a photoresist 124 on the polysilicon layer 122, wherein the photoresist 124 has predetermined assistant gate patterns and select gate patterns to expose a portion of the polysilicon layer 122.

Figure 8:
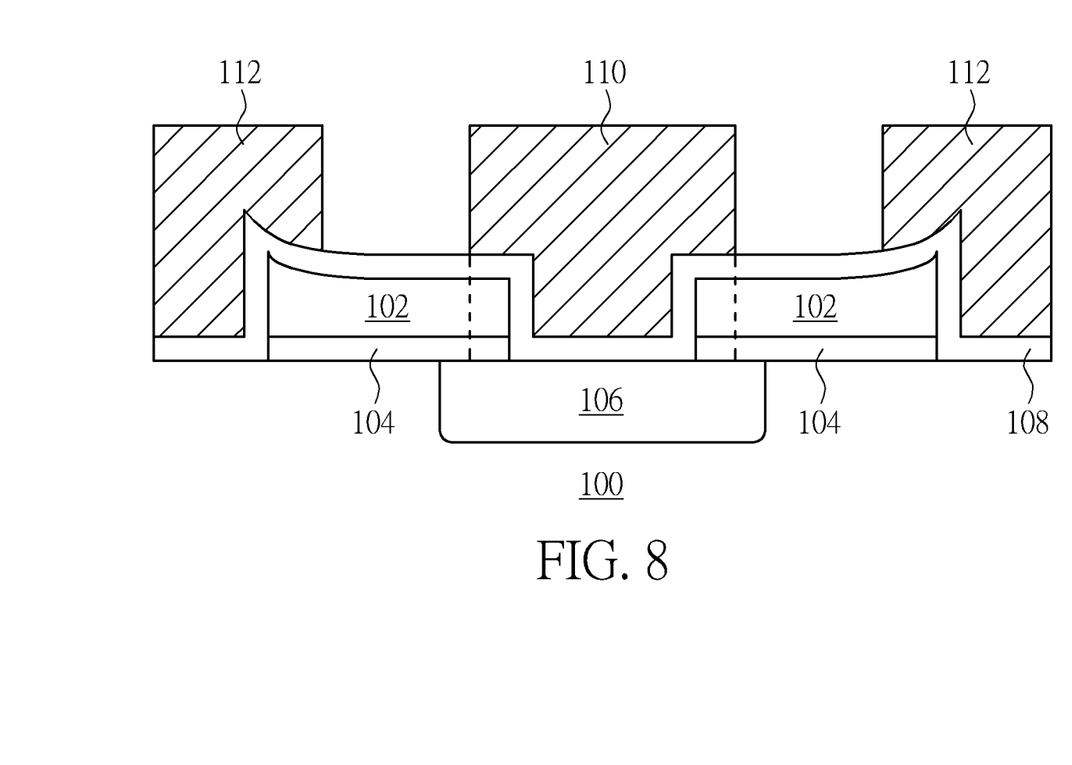

Next, please refer to FIG. 8. Perform an anisotropic etch process with the photoresist 124 as a mask to remove exposed polysilicon layer 122, thereby forming the assistant gate 110 and the select gates 112 as shown in FIG. 8. It can be seen in the figure that the assistant gate 110 is formed between the two floating gates 102 with the insulating layer 108 electrically insulating therebetween. A portion of the assistant gate 110 is embedded into the space between the two floating gates 102 and the assistant gate 110 partly overlaps the two floating gates 102, so that the assistant gate 110 would wrap around portions of adjacent two floating gates 102. Therefore, the coupling ratio of the floating gate 102 may be further improved through the assistant gate 110. Two select gates 112 are disposed respectively on the insulating layer 108 at outsides of the two floating gates 102, wherein the select gate 112 partly overlaps the floating gate 102 to provide the path for erasing electrons. Since they are formed in the same process, the top surfaces of the assistant gate 110 and the select gate 112 may be in the same horizontal plane. The photoresist 124 may be removed after the assistant gate 110 and the select gate 112 are formed.

Figure 9:
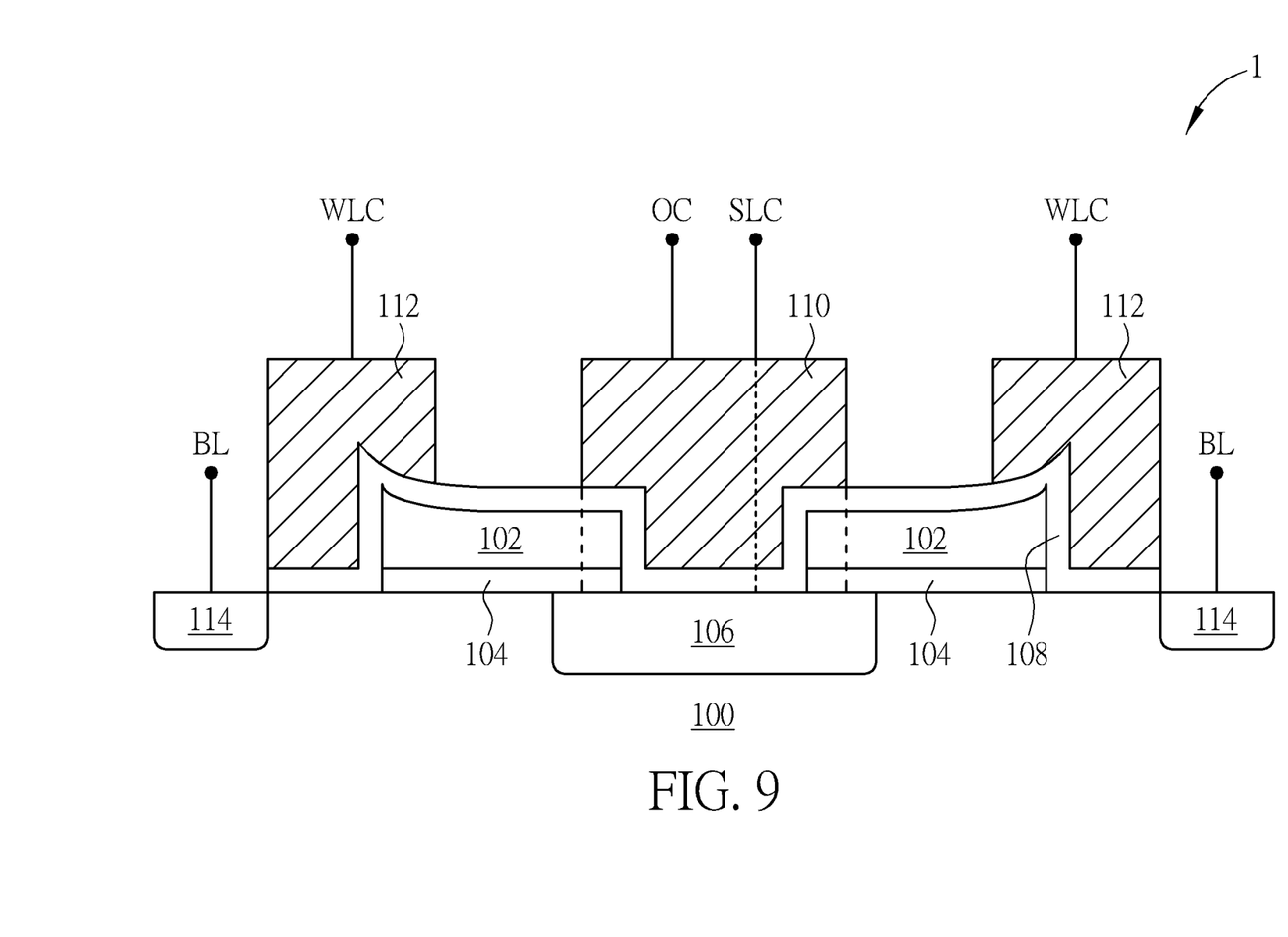

Finally, please refer to FIG. 9. After the select gate 112 is formed, perform another ion implantation process to form drains 114 respectively in the substrate 100 at outsides of the two select gates 112, thereby completing the basic structure of flash memory 1 in the present invention. Thereafter, the fabrication of interconnections such as contacts and metal wirings may be further performed to connect the source 106, drains 114, assistant gate 110 and the select gates 112 to necessary voltage control circuits, such as bit line BL, word line voltage control circuit WLC, source line voltage control circuit SLC, operating voltage control circuit OC, etc. The fabrication of flash memory 1 is, therefore, completed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash memory, comprising:
a substrate;
two floating gates disposed on said substrate;
an insulating layer conformally formed on said two floating gates and said substrate;
an assistant gate disposed on said insulating layer between said two floating gates, wherein a portion of said assistant gate wraps around said two floating gates;
two select gates disposed respectively on said insulating layer at outsides of said two floating gates and partly overlap said floating gate, wherein said floating gate has a point portion protruding upwardly at corner overlapping said select gate; and
in the erase operation, said assistant gate is applied with a negative voltage and said select gate is applied with a positive voltage, and said point portion of said floating gate enhances electrons tunneling through said insulating layer between said floating gate and said select gate.

2. The flash memory of claim 1, further comprising:
a source formed in said substrate between said two floating gates, wherein said source partly overlaps said two floating gates; and
two drains formed respectively in said substrate at outsides of said two select gates.

3. The flash memory of claim 2, wherein said source is a source line, said drain connects to a bit line, said select gate is a word line, and said assistant gate connects to an operating voltage control circuit.

4. The flash memory of claim 1, wherein the material of said floating gates, said assistant gate and said select gates are polysilicon.

\* \* \* \* \*